(12) United States Patent
Yamashita et al.

(10) Patent No.: US 6,172,560 B1
(45) Date of Patent: Jan. 9, 2001

(54) AMPLIFIER WITH FEEDFORWARD LOOPS FOR REJECTING NON-LINEAR DISTORTION

(75) Inventors: Kazuo Yamashita; Yasushi Nakagawa; Akira Yamada, all of Mitaka (JP)

(73) Assignee: Japan Radio Co., Ltd., Tokyo (JP)

( * ) Notice: Under 35 U.S.C. 154(b), the term of this patent shall be extended for 0 days.

(21) Appl. No.: 09/418,014

(22) Filed: Oct. 14, 1999

(30) Foreign Application Priority Data

Oct. 22, 1998 (JP) .................................................. 10-300667
Jul. 6, 1999 (JP) .................................................. 11-191901

(51) Int. Cl.[7] ...................................................... H03F 3/66
(52) U.S. Cl. .............................................. 330/52; 330/151
(58) Field of Search .............................. 330/52, 149, 151

(56) References Cited

U.S. PATENT DOCUMENTS

| | | | |
|---|---|---|---|
| 5,307,022 | * 4/1994 | Tattersall, Jr. et al. | ................. 330/52 |
| 5,489,875 | 2/1996 | Cavers . | |
| 5,528,196 | 6/1996 | Baskin et al. . | |
| 5,565,814 | 10/1996 | Fukuchi . | |
| 5,768,699 | 6/1998 | Behan et al. . | |
| 5,977,825 | * 11/1999 | Mueck | .................................. 330/151 |
| 6,081,156 | * 6/2000 | Choi et al. | ............................. 330/52 |
| 6,094,096 | * 7/2000 | Myer | ....................................... 330/52 |

FOREIGN PATENT DOCUMENTS

| | | |
|---|---|---|
| 0 803 974 A1 | 10/1997 | (EP) . |
| 4-70203 | 3/1992 | (JP) . |
| 6-85548 | 3/1994 | (JP) . |
| 6-244647 | 9/1994 | (JP) . |

* cited by examiner

*Primary Examiner*—Robert Pascal
*Assistant Examiner*—Henry Choe
(74) *Attorney, Agent, or Firm*—Oliff & Berridge, PLC

(57) ABSTRACT

An amplifier with feedforward loops for rejecting non-linear distortion and control circuitry for such amplifier and employing a distortion compensation method. A signal from a dominant path is input into a synchronizing detector via an ALC circuit as a reference signal. Using this reference signal, an error signal output from a distortion rejection loop is subjected to synchronizing detection. An offset voltage of a mixer inside the synchronizing detector can be prevented from varying due to change in local level. Outputs from synchronizing detectors are used for control to optimize corresponding loops. As a pilot signal for a distortion detection loop can be eliminated, undesirable spurious effects due to such a pilot signal is avoided. The acquisition time of each of the loops can be shortened because an optimizing control using a step-by-step procedure under CPU control can be eliminated.

14 Claims, 8 Drawing Sheets

AMPLIFIER WITH FEEDFORWARD LOOPS FOR REJECTING NON-LINEAR DISTORTION

BACKGROUND OF THE INVENTION

1. Field of the Invention

The present invention relates to an amplifier with feedforward (abbreviated hereinafter as FF) loops for rejecting non-linear distortion and control circuitry for optimizing FF loops which employs a method for compensating distortion generated in a main amplifier. The present invention particularly relates to a technique for compensating distortion such as intermodulation distortion generated in a main amplifier.

2. Description of Related Art

A base station or a relay station for mobile communications performs wireless transmission of a multicarrier signal including a number of modulated carriers. More specifically, a base station or a relay station modulates each of the multiple carriers and arranges those carriers on a frequency axis at a certain frequency separation to obtain a multicarrier signal. The base station or the relay station then executes radio-frequency amplification (RF amplification) of the obtained multicarrier signal, and performs wireless transmission of the multicarrier signal after the RF amplification. Accordingly, such a station requires an amplifier for executing RF amplification of a multicarrier signal. Further, in order to favorably communicate with a mobile station located within a coverage or a cell, the station typically requires a RF amplifier that can perform high power amplification. A similar need also exists in a booster or like devices.

In an amplifier used for amplifying a multicarrier signal, superior linearity is required over the entire frequency range to which the multicarrier signal belongs because, if the linearity of the amplifier is not sufficient, normal and high-quality communication would be obstructed by distortion generated in the amplifier. A variety of distortions exist that are caused by the non-linearity of the amplifier. Among those distortions, distortion being produced at a frequency identical to or extremely close to that of a carrier like IMD (intermodulation distortion) cannot be, or remains very difficult to be, eliminated by an approach such as providing a filter after the amplifier. Nevertheless, distortions having such nature are likely to occur when amplifying a multicarrier signal.

One approach for providing an amplifier having an extremely low amount of distortion which is suitable for amplifying a multicarrier signal is to improve the linearity of the amplifier by adding circuitry to the amplifier. One known example technique of such an approach is the FF amplification method disclosed in Japanese Patent Laid-Open Publication No. Hei 4-70203. An amplifier adopting the FF amplification method comprises a distortion detection loop and a distortion rejection loop.

The signal path from the signal input terminal to the signal output terminal passing through the main amplifier, that is, the signal path for transmitting the input signal into the main amplifier to be amplified and the signal amplified by the main amplifier, is referred to as the dominant path. To simplify notation in the present application, the signal transmitted in the dominant path is hereinafter referred to as the dominant signal. The signal passing through the dominant path before the main amplifier is referred to as the input signal. The signal passing through the dominant path from the output terminal of the main amplifier to the point of being subjected to distortion compensation is referred to as the output signal. The signal passing through the dominant path after the point of distortion compensation is referred to as the distortion-compensated output signal.

The distortion detection loop provides as a feedforward a first branch signal obtained by branching a portion of the input signal at a first branching point to a first coupling point located thereafter. At a second branching point located after the first branching point and a main amplifier, a portion of the output signal is branched as a second branch signal. The second branch signal and the first branch signal provided as a feedforward are combined at the first coupling point.

The input signal and the first branch signal branched therefrom include a plurality of carrier components constituting the multicarrier signal, but do not, at any time, include distortion components generated in the main amplifier or its surrounding circuitry (hereinafter collectively referred to as "the main amplifier"). On the other hand, when distortion components are being generated in the main amplifier, the output signal and the second branch signal branched therefrom include both the carrier components and the distortion components. Accordingly, when combining the first and the second branch signals, if the first and the second branch signals to be combined are in a relationship such that their respective carrier components cancel each other out, a signal including only the distortion components can be obtained. A signal obtained as such is hereinafter referred to as the distortion signal.

To obtain a highly pure distortion signal having only the distortion components, the first and the second branch signals must be in a relationship such that their respective carrier components completely cancel each other. Specifically, a first requirement for this relationship is that the electrical wave length of the signal path from the first branching point to the first coupling point passing through the distortion detection loop must be identical with the electrical wave length of the signal path from the first branching point to the first coupling point passing through the main amplifier and the second branching point. A second requirement is that, at the first coupling point, the first and the second branch signals must have an identical amplitude and an opposite phase from one another.

The distortion rejection loop provides the distortion signal as a feedforward to be recombined with the output signal at a second coupling point located after the first and the second branching points. If the signal delay occurring in the distortion rejection loop is compensated in the dominant path, and if the distortion components in the output signal and the distortion signal through the auxiliary amplifier are appropriately adjusted in the distortion rejection loop or in the dominant path such that their respective amplitudes are identical and their phases are opposite from one another, the signal recombining operation at the second coupling point rejects distortion components generated in the main amplifier to provide a distortion-compensated output signal having no, or a suppressed amount of, distortion components.

FIG. 8 shows an example configuration of a conventional FF amplifier. In this amplifier, three hybrids HYB1–HYB3 are used to form the distortion detection loop L1 and the distortion rejection loop L2. In the Figure, the signal path from the signal input terminal IN to the signal output terminal OUT passing through the main amplifier A1 and the coaxial delay line D2 is the dominant path. The signal path from the first branching point inside hybrid HYB1 to the first coupling point inside hybrid HYB2 passing through the coaxial delay line D1 is the distortion detection loop L1. The signal path from the first coupling point to the second coupling point inside hybrid HYB3 passing through the auxiliary amplifier (distortion amplifier) A2 is the distortion rejection loop L2. Respective dummy loads Z0 in the Figure have an impedance equal to the characteristic impedance of the transmission line, and is used as the termination for hybrids HYB1 and HYB3 terminals. The second branching point is located inside hybrid HYB2.

The signal applied to the signal input terminal IN, namely, the input signal, is a multicarrier signal, for example. This signal is input, via hybrid HYB1, into variable attenuator ATT1 and variable phase shifter PS1. After being subjected to amplitude and phase adjustment therein, the input signal is amplified by the main amplifier A1. The signal amplified by the main amplifier A1, namely, the output signal, is input into hybrid HYB3 via hybrid HYB2 and the coaxial delay line D2. Further, the distortion-compensated output signal is output from hybrid HYB3 to subsequent circuitry via the signal output terminal OUT. The coaxial delay line D2 is the delay line for compensating the delay exerted on the distortion signal by the circuitry that constitute the distortion rejection loop L2 including the auxiliary amplifier A2.

Furthermore, the input signal is branched into two signals by hybrid HYB1. The two branched signals are identical signals with respect to frequency structure of their components. One of the two branched signals which is to be provided in the dominant path is supplied to the main amplifier A1 as the input signal and is thereby amplified. The other of the two branched signals which is to be provided in the distortion detection loop L1, namely, the first branch signal, is supplied from hybrid HYB1 to hybrid HYB2 via the coaxial delay line D1 while its amplitude is mostly maintained as is. The coaxial delay line D1 is the delay line for compensating the delay exerted on the dominant signal by the circuitry of the dominant path, especially the main amplifier A1.

At the second branching point located therein, hybrid HYB2 branches into two signals the signal output from the main amplifier A1 including distortion components. The two branched signals are identical signals with respect to frequency structure of the components. One of the two branched signals is supplied to the dominant path as the output signal. The other of the two branched signals, namely, the second branch signal, is combined with the first branch signal in the first coupling point inside hybrid HYB2. If the distortion detection loop L1 is optimized as described below, this combining operation in hybrid HYB2 cancels the carrier components in the first and the second branch signals, producing the distortion signal indicating the distortion components generated in the main amplifier A1.

The distortion signal obtained in this way is supplied from hybrid HYB2 sequentially to variable attenuator ATT2, variable phase shifter PS2, and the auxiliary amplifier A2, constituting the distortion rejection loop L2. Specifically, the distortion signal is subjected to amplitude and phase adjustment in variable attenuator ATT2 and variable phase shifter PS2, amplified by the auxiliary amplifier A2, and input into hybrid HYB3. The distortion signal input into hybrid HYB3 is combined in the second coupling point inside hybrid HYB3 with the dominant signal transmitted via the coaxial delay line D2. If both of the distortion detection loop L1 and the distortion rejection loop L2 are optimized as described below, this combining operation in hybrid HYB3 produces the distortion-compensated output signal in which the distortion components are eliminated or suppressed (by canceling out). The distortion-compensated output signal is output from the signal output terminal OUT.

To generate a highly pure distortion signal by combining the first and the second branch signals and canceling out the carrier components, a predetermined number of carrier components contained in respective ones of the first and the second branch signals must have an identical timing, an identical amplitude, and an opposite phase from one another at the first coupling point. To fulfill these requirements, that is, to optimize the distortion detection loop L1, the circuit shown in FIG. 8 is provided with the coaxial delay line D1 as means for providing an identical timing to the respective carrier components, and variable attenuator ATT1, variable phase shifter PS1, and the control circuit 10 as means for providing an identical amplitude and an opposite phase to the respective carrier components. The control circuit 1 is the means for adjusting the output of hybrid HYB2 such that a distortion signal including primarily only the distortion components and no carrier components is supplied to the auxiliary amplifier A2. This adjustment is performed in the control circuit 10 by adjusting and controlling the signal attenuation G1 and the phase shift θ1 in variable attenuator ATT1 and variable phase shifter PS1 to their respective optimal values.

To generate a favorable distortion-compensated output signal through combining the output signal and the distortion signal, it is preferred that the distortion signal transmitted via the auxiliary amplifier A2 primarily includes no carrier components but only the distortion components. This can be fulfilled by optimizing the distortion detection loop L1, because, as long as the distortion detection loop L1 is operating normally, distortion generating in the auxiliary amplifier A2 can be ignored. The second requirement in compensating distortion generated in the main amplifier A1 is that, at the second coupling point, the distortion components in the output signal transmitted via the coaxial delay line D2 and those in the distortion signal via the auxiliary amplifier A2 must have an identical timing, an identical amplitude, and an opposite phase with respect to one another. To fulfill this second requirement, that is, to optimize the distortion rejection loop L2, the circuit shown in FIG. 8 is provided with the coaxial delay line D2 as means for providing an identical timing to the distortion components in respective signals, and variable attenuator ATT2, variable phase shifter PS2, and the control circuit 10 as means for providing an identical amplitude and an opposite phase to the distortion components in respective signals. The control circuit 10 adjusts and controls the signal attenuation G2 and the phase shift θ2 in variable attenuator ATT2 and variable phase shifter PS2 to their respective optimal values to generate a distortion-compensated output signal in which the distortion components are eliminated or suppressed.

The control circuit 10 executes the adjustment and control of the above-mentioned G1, θ1, G2, and θ2 to their optimal values, which are the processes for optimizing the distortion detection loop L1 and the distortion rejection loop L2. In FIG. 8, these optimizing processes are executed by the control circuit 10 through insertion and detection of two kinds of pilot signals under the control of the CPU.

The control circuit 10 comprises oscillators OSC1 and OSC2, and is connected with directional couplers DC1–DC4. Oscillators OSC1 and OSC2 generate the pilot signals for L1 and L2, respectively.

Directional coupler DC1 connected to oscillator OSC1 is disposed before the first branching point located inside hybrid HYB1, so as to insert the pilot signal for L1 into the input signal and the first branch signal branched therefrom. Directional coupler DC2 is disposed along the path between the first coupling point inside hybrid HYB2 and the second coupling point inside hybrid HYB3 passing through the auxiliary amplifier A2, so as to detect the presence of the pilot signal for L1 and its level in the distortion signal.

Directional coupler DC3 connected to oscillator OSC2 is disposed along the path between the first branching point inside hybrid HYB1 and the second branching point inside hybrid HYB2 passing through the main amplifier A1 (may be inside the main amplifier A1), so as to insert the pilot signal for L2 into the output signal and the second branch signal branched therefrom. Directional coupler DC4 is disposed between the second coupling point inside hybrid HYB3 and the signal output terminal OUT, so as to detect the presence of the pilot signal for L2 and its level in the distortion-compensated output signal.

The control circuit 10 inserts or superimposes the pilot signal for L1 in the input signal using directional coupler DC1, and detects the pilot signal for L1 using directional coupler DC2. The control circuit 10 controls the signal attenuation G1 and the phase shift $\theta 1$ such that the detected level of the pilot signal for L1 becomes lower in directional coupler DC2, thereby optimizing the distortion detection loop L1. In other words, the signal attenuation G1 and the phase shift $\theta 1$ are controlled such that the pilot signal for L1 does not appear in the distortion signal.

Further, the control circuit 10 inserts or superimposes the pilot signal for L2 in the output signal using directional coupler DC3 before the second branching point, and detects the pilot signal for L2 using directional coupler DC4. The control circuit 10 then controls the signal attenuation G2 and the phase shift $\theta 2$ such that the detected level of the pilot signal for L2 becomes lower in directional coupler DC4, thereby optimizing the distortion rejection loop L2. In other words, the signal attenuation G2 and the phase shift $\theta 2$ are controlled such that the pilot signal for L2 does not appear in the distortion-compensated output signal.

Processes for determining G1, $\theta 1$, G2, and $\theta 2$ are primarily executed by the CPU 12 and the control signal generator 14 inside the control circuit 10.

Out-of-band undesired signals are first eliminated from the signals detected in directional couplers DC2 and DC4 using band-pass filters BPF1 and BPF2, respectively. To further facilitate signal handling, these signals are then mixed with an oscillated output of the local oscillator LOC using mixers MIX1 and MIX2. From among the resulting signals, low-pass filters LPF1 and LPF2 extract the difference frequency components, namely, the signals converted to a lower frequency than original. The extracted components are input into the control signal generator 14 via amplifiers or buffers B1 and B2. The control signal generator 14 generates control signals related to G1, $\theta 1$, G2, and $\theta 2$ under the control of the CPU 12 following a step-by-step logic and method. The step-by-step method herein refers to a repeated sequential execution of the process of slightly shifting the values of the control signals in an arbitrary direction to search for the direction of change toward which the output levels from amplifiers or buffers B1 and B2 would be lower, and changing the control signal values in that direction.

Although an amplifier having an extremely low amount of distortion suitable for amplification of a multicarrier signal can be formed according to the above-described circuit arrangement, several problems still remain.

When there are changes in, for example, the level of the input signal, the number of carriers, and temperature level, operating conditions are altered in the main amplifier A1 and the auxiliary amplifier A2. If the control signals are generated by the step-by-step process as described above, it is difficult to follow rapidly such an alteration in operating conditions of the main amplifier A1 and the auxiliary amplifier A2 upon its occurrence. In other words, the time it takes for the loops to balance under the new operating conditions after alterations and for the detected levels of the pilot signals to accordingly settle close to zero, namely, the acquisition time of the loops with respect to alterations in operating conditions, becomes long such that it cannot in practice be ignored.

Especially, if the above-described conventional technique is used in the above-mentioned field of RF amplifiers for transmission in a base station for mobile communications, for example, the acquisition time of the loops with respect to alterations in operating conditions may be as long as 3 to 10 seconds. Moreover, the auxiliary amplifier A2 may receive excessive input during the time period from the occurrence of an operating condition alteration to the balancing of the distortion detection loop L1, and, when such state is notable, the auxiliary amplifier A2 may become damaged.

As the pilot signal for L1 is included in the output signal transmitted via the coaxial delay line D2, the pilot signal for L1 undesirably remains in the distortion-compensated output signal. The residual pilot signal for L1 may become an impediment to operation in subsequent circuitry. For example, in the application of RF amplifier for transmission in a base station for mobile communications, undesirable spurious effect is caused when the distortion-compensated output signal having residual pilot signal for L1 is supplied as is to an antenna.

To prevent such undesirable effects by using additional circuitry in the circuit of FIG. 8, for example, a notch filter for blocking the pilot signal for L1 may be disposed in a section after the second branching point inside hybrid HYB2 along the dominant path. Alternatively, a circuit may be provided for injecting into the dominant path a signal that cancels out the pilot signal for L1. However, as the notch filter would filter the signal amplified by the main amplifier A1 having high power, a large and expensive notch filter must be used. In addition, disposing a notch filter would cause degradation in phase linearity of the entire circuit. Generation of insertion loss by the notch filter would also lower the operating efficiency of the entire circuit. A circuit for injecting into the dominant path a signal that cancels out the pilot signal for L1, on the other hand, is not practical because its structure would be complex and the control for temperature compensation or the like would be difficult.

SUMMARY OF THE INVENTION

One object of the present invention is to eliminate the necessity for the pilot signal for L1. By doing away with the pilot signal for L1, undesirable spurious effects can be prevented without using a notch filter or a circuit for canceling the pilot signal for L1. Accordingly, a FF amplifier can be provided that generates less spurious radiation, has a smaller size, and is less costly compared to the conventional types. In the present invention, this object is achieved by newly adopting a synchronizing detector for the control of the distortion detection loop.

Another object of the present invention is to eliminate the step-by-step process performed by the CPU and thereby provide a highly reliable FF amplifier with its loops having more reduced acquisition time. In the present invention, this object is accomplished by providing a synchronizing detector for the control of the distortion detection loop and the distortion rejection loop.

When an input signal comprising a plurality of carriers, each having a different frequency from one another, is amplified and output by a main amplifier, the present invention compensates the distortion components included in the output signal from the main amplifier.

The present invention may be implemented as follows. First, a distortion signal is generated by combining, at the first coupling point, the first branch signal branched from the input signal at the first branching point with the second branch signal branched from the output signal at the second branching point. As the first branch signal is a signal branched from the input signal, the first branch signal includes a plurality of carriers but does not include any distortion generated in the main amplifier. The second branch signal is a signal branched from the output signal which is obtained by amplifying the input signal in the main amplifier. The second branch signal therefore includes not only the above mentioned plurality of carriers but also the distortion generated in the main amplifier. In the present invention, amplitude and phase adjustments are conducted in any one of the plurality of signal paths between the first branching point and the first coupling point according to a control signal, in order to prevent the carrier components included in the first and the second branch signals from leaking into the distortion signal when combining those branch signals. As a result, the carrier components cancel out one another, and a distortion signal can be obtained wherein primarily only the distortion components remain. By using the distortion signal obtained in this way, the distortion components included in the output signal from the main amplifier can be compensated, thereby producing a distortion-compensated output signal.

One feature of the present invention is that the distortion signal is subjected to synchronizing detection using a regulated reference signal containing the above mentioned plurality of carrier components. This reference signal is produced by branching a third branch signal from any one of the input signal, output signal, or distortion-compensated output signal, and by regulating the level of the third branch signal such that the average power of the reference signal does not vary even when the total average power of the respective carriers constituting the signal varies. The third branch signal may also be branched from the first or the second branch signal. In the present invention, the signal obtained as a result of the synchronizing detection is used as the control signal for controlling the amplitude and phase adjustment operations at the time of distortion signal generation.

In this way, in the present invention, the control signal is generated through performing synchronizing detection of the distortion signal. Accordingly, no pilot signal is necessary for distortion detection, and generation of undesirable spurious effects caused by such pilot signals can be prevented. It is therefore no longer necessary to provide circuits or devices such as notch filters for preventing radiation of such undesirable spurious effects, allowing smaller size and lower cost. Further, as the control signal is produced through the synchronizing detection, the conventional step-by-step monitoring and control process can be eliminated, thereby enabling high speed acquisition. Moreover, operation of a synchronizing detector for the synchronizing detection can be stable and reliable over a relatively wide range of operating levels because the signal produced as the reference signal for the synchronizing detection is generated by regulating the signal level, for example, through Automatic Level Control (ALC), of the input signal or a signal that similarly contains the plurality of carrier components. The stabilization of operation of the synchronizing detector also applies to the synchronizing detector on the distortion rejection loop side described later.

The FF amplifier embodying the present invention comprises distortion detection means and distortion compensation means.

The distortion detection means may, for example, include a main amplifier, a distortion detection loop, and first amplitude and phase adjustment means. The distortion detection loop is a circuit that generates the distortion signal by combining the first branch signal and the second branch signal. The first amplitude and phase adjustment means perform amplitude and phase adjustment on a signal related to the main amplifier based on a first control signal, such that only the distortion components contained in the output signal from the main amplifier are extracted during the signal combining process in the distortion detection loop. The first control signal is a signal for controlling the amplitude and phase adjustment operations performed on the signal related to the main amplifier at the time of the signal combining process in the distortion detection loop.

The distortion compensation means is the means for generating a distortion-compensated output signal. The distortion compensation means may, for example, comprise an auxiliary amplifier, a distortion rejection loop, and second amplitude and phase adjustment means. The distortion rejection loop generates a distortion-compensated output signal by recombining the distortion signal with the output signal from the main amplifier. The second amplitude and phase adjustment means perform amplitude and phase adjustment on a signal related to the auxiliary amplifier based on a second control signal, such that the distortion components do not leak from the output signal or the distortion signal into the distortion-compensated output signal during the signal recombining process in the distortion rejection loop. The second control signal is a signal for controlling the amplitude and phase adjustment operations performed on the signal related to the auxiliary amplifier at the time of the signal recombining process in the distortion rejection loop.

For the generation of the first control signal, the control circuit includes an ALC circuit and a first synchronizing detector. The ALC circuit generates a reference signal by regulating the level of the input signal or a signal similarly containing the plurality of carrier components, such that the average power of the reference signal does not vary even when the total average power of the respective carriers constituting the signal varies. The first synchronizing detector uses this reference signal to perform synchronizing detection of the distortion signal. In the present invention, the above-described first control signal is generated in this way.

For the generation of the second control signal, the control circuit includes pilot signal insertion means, signal branch means, and a second synchronizing detector. The pilot signal insertion means inserts a pilot signal into the output signal before the second branching point. The pilot signal is therefore present in both the second branch signal and the distortion signal. Accordingly, when the distortion rejection loop is not optimized, the pilot signal appears in the distortion-compensated output signal. The signal branch means branches the distortion-compensated output signal to produce a fourth branch signal. The third branch signal and the fourth branch signal may be the same signal. The second synchronizing detector performs synchronizing detection of the fourth branch signal using the pilot signal as the reference. In this way, the residual amount of pilot signal in the distortion-compensated output signal can be determined, and the second control signal can be generated accordingly.

As described above, the present invention can be expressed as a distortion compensation method suitable for compensating distortion in a FF amplifier, a control circuit that can be used for a FF amplifier, and also as a FF amplifier. Furthermore, the present invention may be practiced in a variety of embodiments.

Amplitude and phase adjustment in each of the loops may be executed through vector modulation of the corresponding signals. A vector modulator for this purpose may be implemented using a mixer or like devices.

Concerning the distortion signal to be subjected to synchronizing detection, it may be desirable to convert this signal into a signal having lower frequency prior to synchronizing detection.

The pilot signal for optimizing the distortion rejection loop is preferably subjected to spectral spreading prior to its insertion. In that case, the fourth branch signal is subjected to spectral despreading prior to synchronizing detection. By these procedures, interference between the pilot signal and the carrier components is prevented.

The pilot signal may be more preferably oscillated at a low frequency and converted to a frequency within the operating frequency band of the main amplifier prior to its insertion. Further, prior to synchronizing detection using the pilot signal as the reference, the fourth branch signal is converted to the same frequency as that of the pilot signal. Oscillation at a low frequency facilitates handling of signals.

Also preferably, with respect to the pilot signal, spectral spreading may precede conversion to a frequency within the operating frequency band of the main amplifier. The fourth branch signal is converted to the same frequency as that of the pilot signal, and is subsequently spectral despread.

DESCRIPTION OF THE PREFERRED EMBODIMENT

Figure 8:
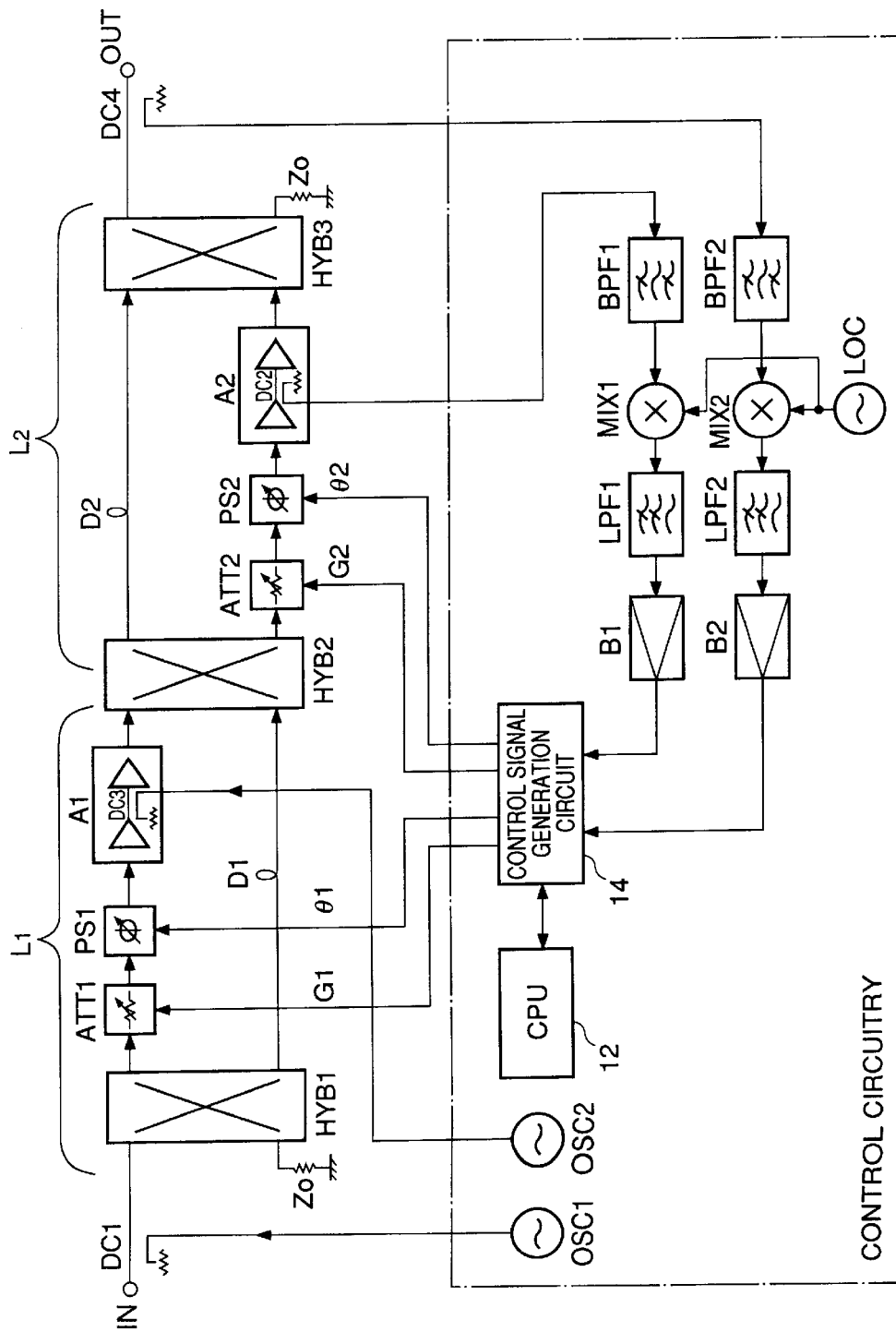
FIG. 8 is a diagram showing an example configuration of a conventional FF amplifier.
Figure 9:
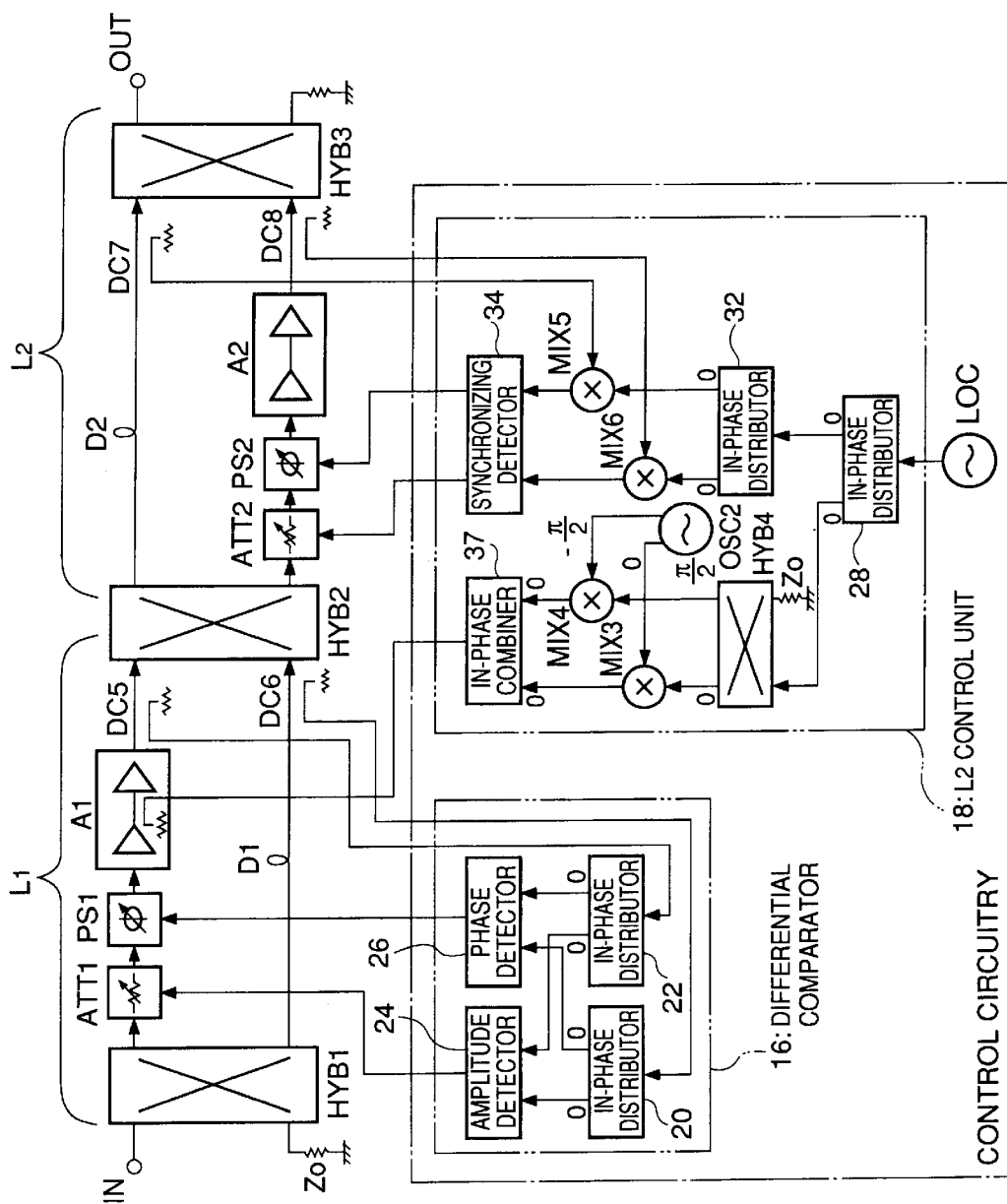
FIG. 9 is a diagram illustrating, as a reference example, a variation configuration of the FF amplifier shown in FIG. 8 based on the art of U.S. Pat. No. 5,528,196.

A preferred embodiment of the present invention will now be described referring to accompanying drawings. Similar or corresponding components as those that appear in the conventional circuit shown in FIG. 8 and the reference circuit shown in FIG. 9 are labeled with identical reference numerals, to avoid redundancy, explanations of those components will not be repeated.

(1) Embodiment

Figure 1:
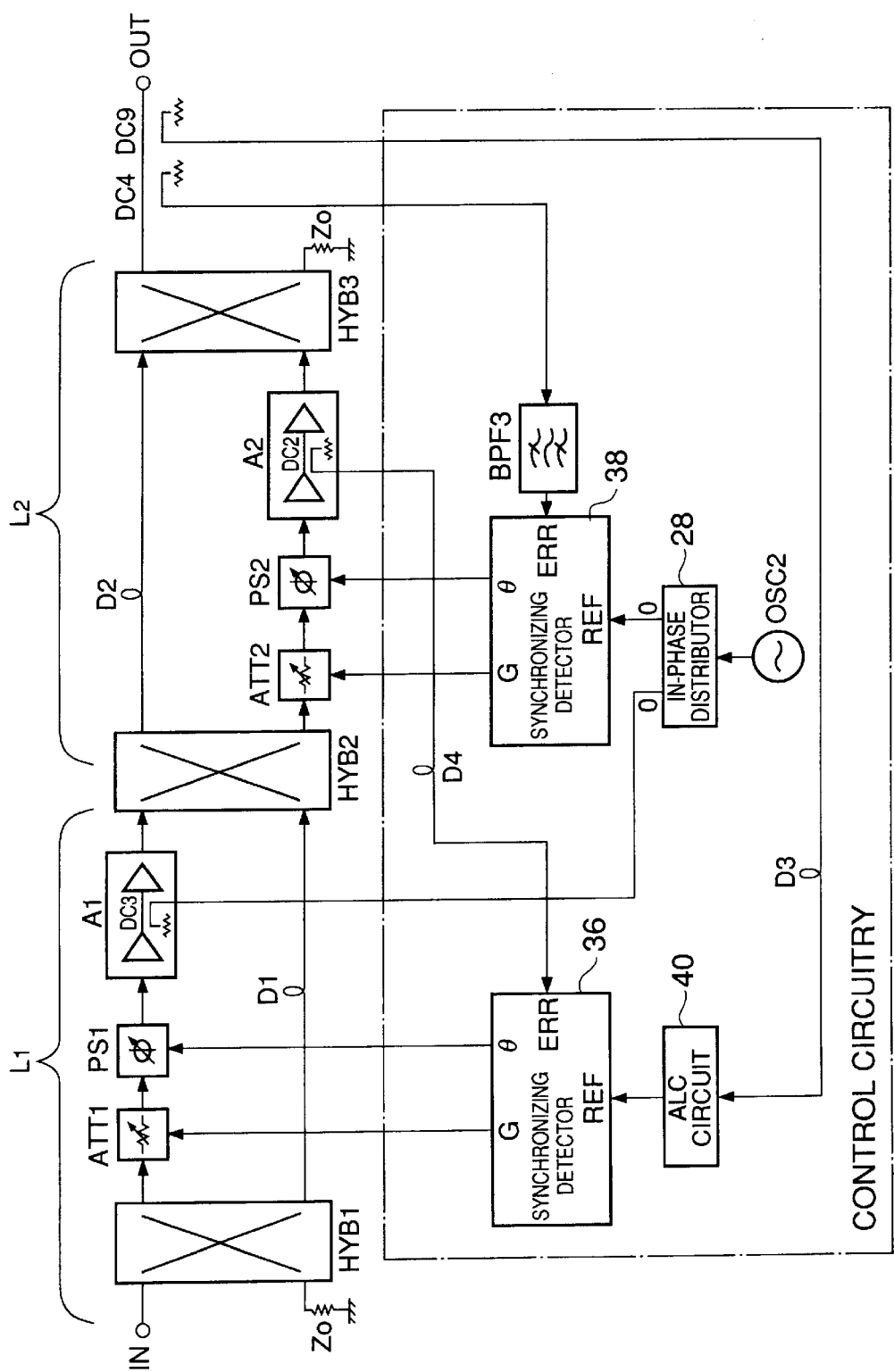
FIG. 1 is a diagram illustrating a circuit configuration according to one embodiment of the present invention.

FIG. 1 illustrates a circuit configuration according to an embodiment of the present invention. The circuit shown in this Figure comprises a control circuit 10B including synchronizing detectors 36,38 and an ALC circuit 40. The synchronizing detectors 36 and 38 are disposed corresponding to the distortion detection loop L1 and the distortion rejection loop L2, respectively. Each of the synchronizing detectors 36 and 38 performs synchronizing detection of the error signal denoted ERR in the Figure using the signal denoted REF as a reference signal (i.e., the error signal component in synchronism with respect to the reference signal is detected). Among the signals obtained by the synchronizing detection, the gain control signal G is the signal for controlling the corresponding variable attenuator, and the phase control signal θ is the signal for controlling the corresponding variable phase shifter.

Figure 2:
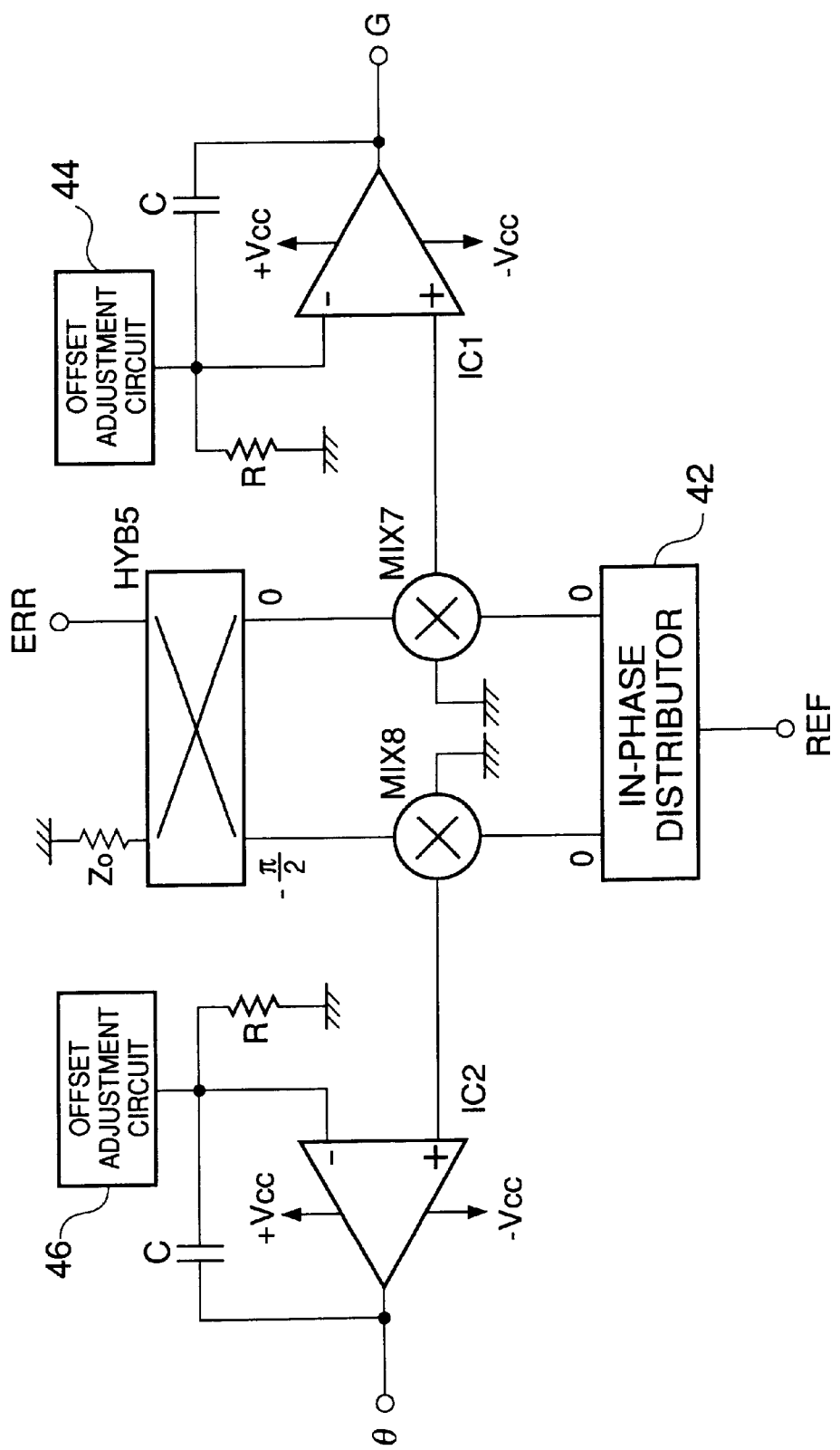
FIG. 2 is a diagram showing a configuration of a synchronizing detector in the present embodiment.

An example of the synchronizing detectors 36 and 38 is shown in FIG. 2. In this example, hybrid HYB5 converts the error signal ERR into signals (ERR$_I$, ERR$_Q$) that are mutually orthogonal in the phase space, and outputs those signals. An in-phase distributor 42 performs in-phase two-way division of the reference signal REF. The example further comprises mixers MIX7 and MIX8 preferably in the form of DBM (Double Balanced Mixers), differential amplifiers IC1 and IC2 preferably in the form of amplifiers having integrated circuit structure, and offset adjustment circuits 44 and 46 for adjusting the offset voltages of mixers MIX7 and MIX8.

Mixer MIX7 mixes the signal ERR$_I$, (0[rad]) from hybrid HYB5 and the reference signal REF from the in-phase distributor 42, and applies the obtained signal to the input terminal (non-inverted input terminal in the Figure) of differential amplifier IC1. Mixer MIX8 mixes the signal ERR$_Q$ (−π/2[rad]) from hybrid HYB5 and the reference signal REF from the in-phase distributor 42, and applies the obtained signal to the input terminal of differential amplifier IC2. Differential amplifiers IC1 and IC2 amplify and output those signals. Voltage occurring at the output terminal of differential amplifier IC1 is used as the gain control signal G supplied to variable attenuator ATT1 or ATT2. Voltage occurring at the output terminal of differential amplifier IC2 is used as the phase control signal θ supplied to variable phase shifter PS1 or PS2.

Connected to another input terminal (inverted input terminal in the Figure) on each of differential amplifiers IC1 and IC2 are a capacitor C one end of which is connected to the output terminal, a resistor R one end of which is grounded, and an offset adjustment circuit 44 or 46. Offset adjustment circuits 44 and 46 are circuits for canceling offset voltages generated at the levels of some mV in respective mixers MIX7 and MIX8. Offset adjustment circuits 44 and 46 generate necessary adjustment voltages for this purpose, and apply the voltages as the reference voltages to differential amplifiers IC1 and IC2. It is noted that the outputs from mixers MIX7 and MIX8, after being subjected to differential amplification in differential amplifiers IC1 and IC2, must possess a polarity that applies negative feedback to the FF loop. Accordingly, to which of the input terminals, inverted or non-inverted, the outputs from mixers MIX7 and MIX8 is applied is determined depending on the operation characteristics of each of the variable attenuators and the variable phase shifters. It is then obvious to which of the input terminals of differential amplifiers IC1 and IC2 the reference voltages would be applied.

The control circuit 10B shown in FIG. 1 comprises the above-described synchronizing detectors 36 and 38, the ALC circuit 40 for supplying a reference signal to synchronizing detector 36, oscillator OSC2 for oscillating the pilot signal for L2, and the in-phase distributor 28 for performing in-phase two-way division of the pilot signal for L2. Further, the control circuit 10B is connected with directional coupler DC2 located within the path from the first coupling point in hybrid HYB2 to the second coupling point in hybrid HYB3 passing through the auxiliary amplifier A2. The control circuit 10B is also connected with directional coupler DC3 located within the path from the first branching point in hybrid HYB1 to the second branching point in hybrid HYB2 passing through the main amplifier A1 (DC3 may be disposed inside the main amplifier A1). The control circuit 10B is further connected with directional couplers DC4 and DC9 located between the second coupling point in hybrid HYB3 and the signal output terminal OUT. In addition, the control circuit 10B comprises a band-pass filter BPF3 for eliminating out-of-band noise from the output from directional couplers DC4. Directional coupler DC9 may be disposed in any location as long as it can detect a signal having an identical carrier arrangement as that of the input signal.

Synchronizing detector 36 receives the error signal ERR, which is the distortion signal, from directional coupler DC2 via coaxial delay line D4, and the reference signal REF, which is the third branch signal, from directional coupler DC9 via coaxial delay line D3 and the ALC circuit 40. Coaxial delay lines D3 and D4 compensate the difference in electrical wave length between the signal paths from the respective directional couplers to synchronizing detector 36. The ALC circuit 40 automatically controls the level of the signal transmitted through coaxial delay line D3 to maintain the reference signal at a fixed level even when the carrier average power varies. This prevents the change in DC offset in mixers MIX7 and MIX8 inside synchronizing detector 36 (as described later).

Synchronizing detector 38 receives the error signal ERR, which is the fourth branch signal, from directional coupler DC4 via the band-pass filter BPF3, and the reference signal REF distributed by the in-phase distributor 28. The other remaining signal of the divided output from the in-phase distributor 28 is inserted into the signal in the dominant path as the pilot signal for L2 using directional coupler DC3.

In the present arrangement, offset voltages in the above-described mixers MIX7 and MIX8 are inherent to respective mixers, and, in addition, vary depending on the local level of the mixers. The inherent differences in offset voltages among the individual mixers can generally be compensated by the above-described offset adjustment circuits 44 and 46. However, offset adjustment circuits 44 and 46 cannot compensate for changes in offset voltages due to alterations in the level of the reference signal REF, namely, alterations in the local level. When an offset voltage changes following an alteration in the local level, the value of the control signal G or θ deviates from the optimal value for variable attenuator ATT1 or ATT2 and variable phase shifter PS1 or PS2, resulting in loss of the balanced state of the distortion detection loop L1 or the distortion rejection loop L2. In the present embodiment, to maintain the local levels of mixers MIX7 and MIX8 at fixed levels, a signal from oscillator OSC2, namely, a signal having a stable level, is supplied to synchronizing detector 38, and the output from the ALC circuit 40, namely, a signal subjected to level stabilizing processing, is supplied to synchronizing detector 36, to serve as reference signals REF in respective synchronizing detectors.

Figure 3:
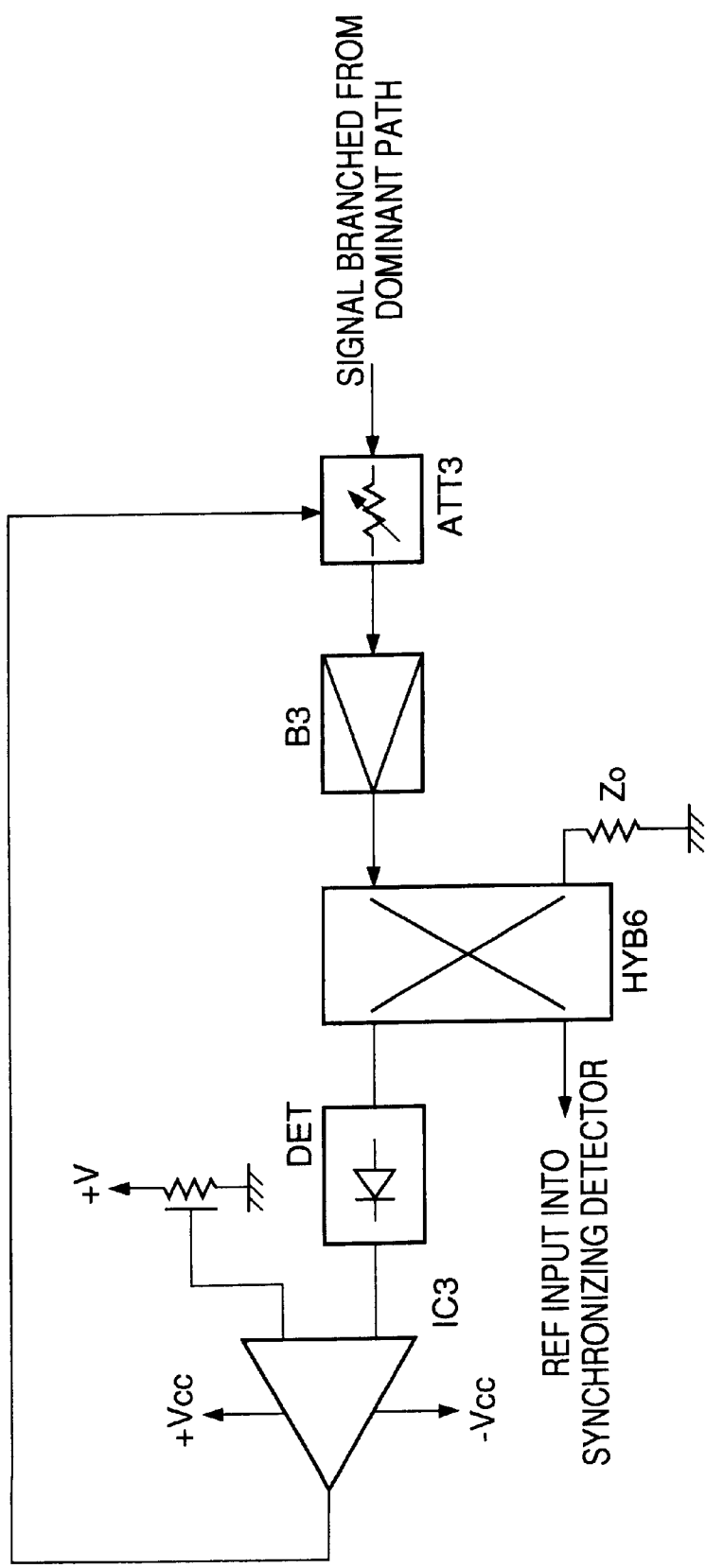
FIG. 3 is a diagram showing a configuration of an ALC circuit in the present embodiment.

As shown in FIG. 3, the ALC circuit 40 comprises the following components. Variable attenuator ATT3 adjusts the amplitude of the signal from directional coupler DC9 disposed within the dominant path. Hybrid junction HYB6 performs two-way division of the signal subjected to this amplitude adjustment. Amplifier or buffer B3 is disposed between variable attenuator ATT3 and hybrid HYB6. Further, in the ALC circuit 40, a detector DET detects one of the branched outputs from hybrid HYB6 and outputs the resulting detected voltage. The ALC circuit 40 further includes differential amplifier IC3, which is preferably implemented using an integrated circuit, for amplifying the detected voltage.

The signal from directional coupler DC9 is input into hybrid HYB6 via variable attenuator ATT3 and amplifier or buffer B3. One of the branched outputs from hybrid HYB6 is detected by the detector DET having a structure that activates a detection diode in a square-law detection area. The detected voltage is supplied as the attenuation ratio control signal via differential amplifier IC3 to variable attenuator ATT3 located before hybrid HYB6. Through attenuation ratio control by variable attenuator ATT3, the other branched output from hybrid HYB6 is maintained at a fixed output level within a sufficiently wide dynamic range.

The detector DET may be configured, for example, as disclosed by the present applicant in Japanese Patent Application No. Hei 10-119292 and No. Hei 10-250582. In this configuration, a temperature compensation diode is disposed in parallel with a detection diode. These diodes are biased in the forward direction under identical conditions, and temperature compensation is performed according to the forward voltage of the temperature compensation diode. When the detection diode constituting the detector DET is activated in a square-law detection area, the detector DET operates in the average detection mode. Accordingly, the level of the reference signal REF supplied from the ALC circuit 40 to the synchronizing detector 36 is prevented from being altered only by changes in the number of carriers, presence or absence of modulation, and variations in modulation methods. In general, when a detection diode is activated in a square-law detection area, problems occur such as fluctuations in forward voltage due to temperature change, generation of non-linear distortion due to such forward voltage fluctuations, and non-uniformity in detection efficiency. However, these problems are suppressed by using the detector DET having the configuration of the above-mentioned patent application.

(2) Advantages and Examples

According to the above-described embodiment, as the control related to optimization of the distortion detection loop L1 and the distortion rejection loop L2 is performed using synchronizing detectors 36 and 38, a CPU need not be provided to execute the step-by-step procedure, allowing speed-up of loop response to changes in operating conditions. For example, while the acquisition time in a conventional example shown in FIG. 8 is 3–10 seconds, the acquisition time in the present embodiment is reduced approximately to several hundred microseconds in the distortion detection loop and several ten milliseconds in the distortion rejection loop. As a result, excessive input into the auxiliary amplifier A2 is less likely to occur.

In the present embodiment, the pilot signal for L1 can be eliminated because the synchronizing detector 36 is provided for directly performing synchronization processing on the dominant signal, and the distortion detection loop L1 is controlled in accordance with the output from the synchronizing detector 36. This results in the advantages of simplification in circuit configuration and cost reduction, as it is no longer necessary to provide structures such as a notch filter to prevent leaking of the pilot signal for L1 from the output terminal OUT, and circuitry for generating the pilot signal for L1.

Furthermore, the distortion detection loop L1 can be operated in a stable manner regardless of changes in the number of carriers or other factors because the reference signal REF supplied to the synchronizing detector 36 is generated using the steps of extracting a portion of the dominant signal and obtaining a stabilized signal through average power detection of the extracted portion.

In addition, by employing the detector previously proposed by the present applicant as the detector DET, the present embodiment can operate, without problems, even when there are changes in operating conditions such as temperature changes.

Although the present embodiment uses hybrids to extract and feedforward a portion of a signal, signal branch means and signal extract means of other types may alternatively be used in place of hybrids. Variable gain amplifiers may be used instead of variable attenuators. Directional couplers for extracting and supplying a signal to the control circuit or for inserting a signal from the control circuit to appropriate sections in the circuitry may be positioned in locations other than that indicated in the Figures as long as the advantages of the present invention remain unchanged. Each of the mixers may be of active or passive type. Differential amplifiers may be used as either an inverted or non-inverted type so long as the relationship of negative feedback with respect to the FF loop is maintained.

Figure 4:
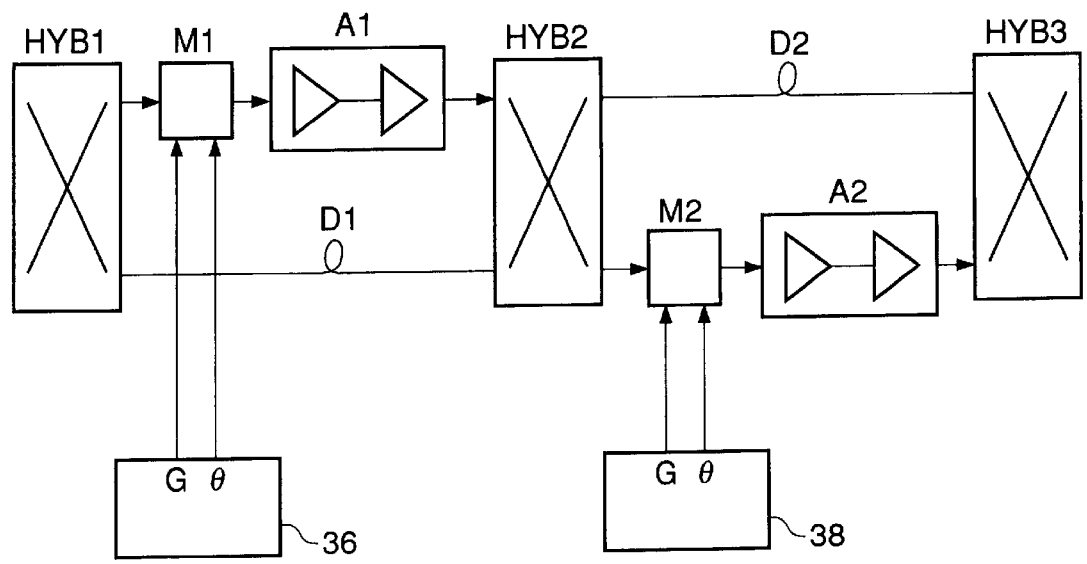
FIG. 4 is a diagram showing a variation example of a component for amplitude and phase adjustment in the present embodiment.
Figure 5:
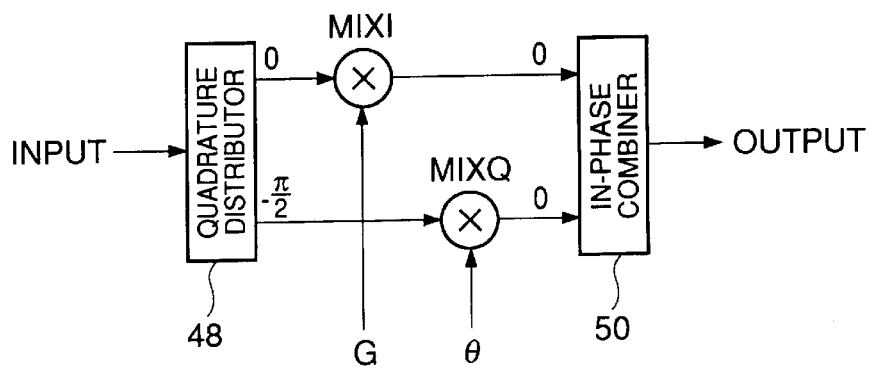
FIG. 5 is a diagram illustrating an example vector modulator.

Further, in place of the combinations of variable attenuators and variable phase shifters, vector modulators may be used as shown in FIG. 4. In FIG. 4, vector modulator M1 is provided in place of variable attenuator ATT1 and variable phase shifter PS1, while vector modulator M2 is disposed in place of variable attenuator ATT2 and variable phase shifter PS2.

Each of the vector modulators M1 and M2 comprises the following components. The quadrature distributor 48 performs orthogonal two-way division of an input signal. Mixer MIXI mixes one of the outputs, I (0 [rad]) component, from the quadrature distributor 48 with the gain control signal G, and outputs the resulting signal. Mixer MIXQ mixes the other output, Q ($-\pi/2$[rad]) component, from the quadrature distributor 48 with the phase control signal θ, and outputs the resulting signal. The in-phase combiner 50 combines the outputs from mixers MIXI and MIXQ in phase. According to this arrangement, the amplitude and the phase of the output from the in-phase combiner 50 can be altered by appropriately changing the amplitude of the gain control signal G and the phase control signal θ. Mixers MIXI and MIXQ may be implemented using DBM or similar devices.

Figure 6:
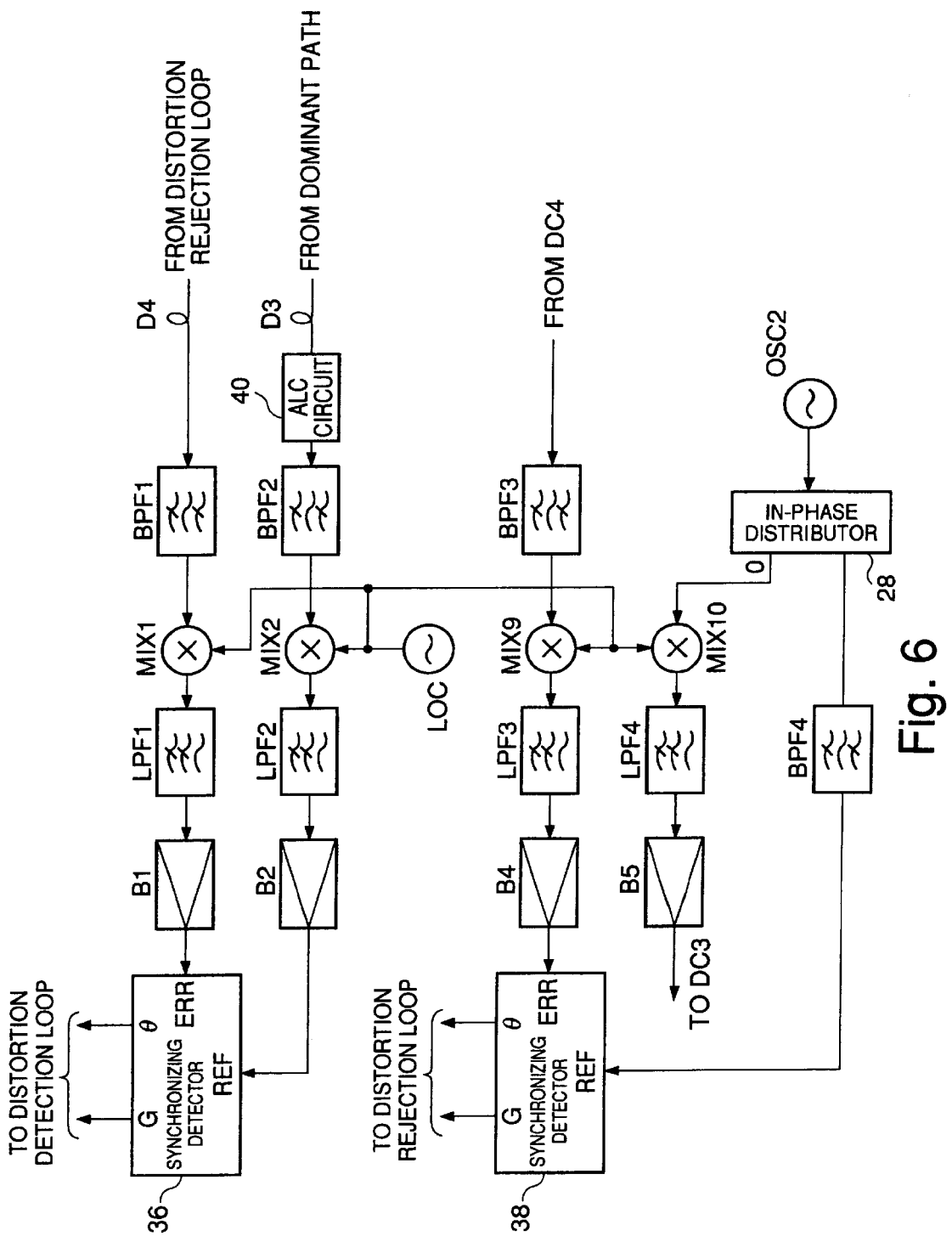
FIG. 6 is a diagram showing a variation example of a control circuit in the present embodiment.

Moreover, as illustrated in FIG. 6, the input signals into the synchronizing detectors 36 and 38 may be converted to a lower frequency similarly as in a conventional technique shown in FIG. 8. In FIG. 6, BPF1–BPF4 are band-pass filters for eliminating out-of-band noise. MIX1, MIX2, MIX9, and MIX10 are mixers for frequency conversion. LPF1–LPF4 are low-pass filters for extracting lower frequency components of the mixer output, namely, signals after frequency conversion. B1–B4 are buffers or amplifiers for supplying those signals to synchronizing detector 36 or 38. LOC is the local oscillator for the frequency conversion. By adopting this configuration wherein synchronizing detection is performed after converting the signals to a low frequency, handling of the signals in the synchronizing detectors 36 and 38 is facilitated. When a difference exists in the electrical wave lengths of the signal paths which should ideally have identical lengths, a frequency characteristic of delay time surfaces, reducing the frequency band width in which distortion can be compensated for, namely, the canceling band width. However, by performing synchronizing detection after converting the signals to a low frequency, such band reduction can be prevented. Further, for a low frequency band, it is easy to provide a filter having a good out-of-band suppression characteristics. Using such filter for the low-pass filter LPF1 and others, a configuration having high resistance to obstructions can be formed. Band-pass filters may be used in place of low-pass filters LPF1–LPF4.

Figure 7:
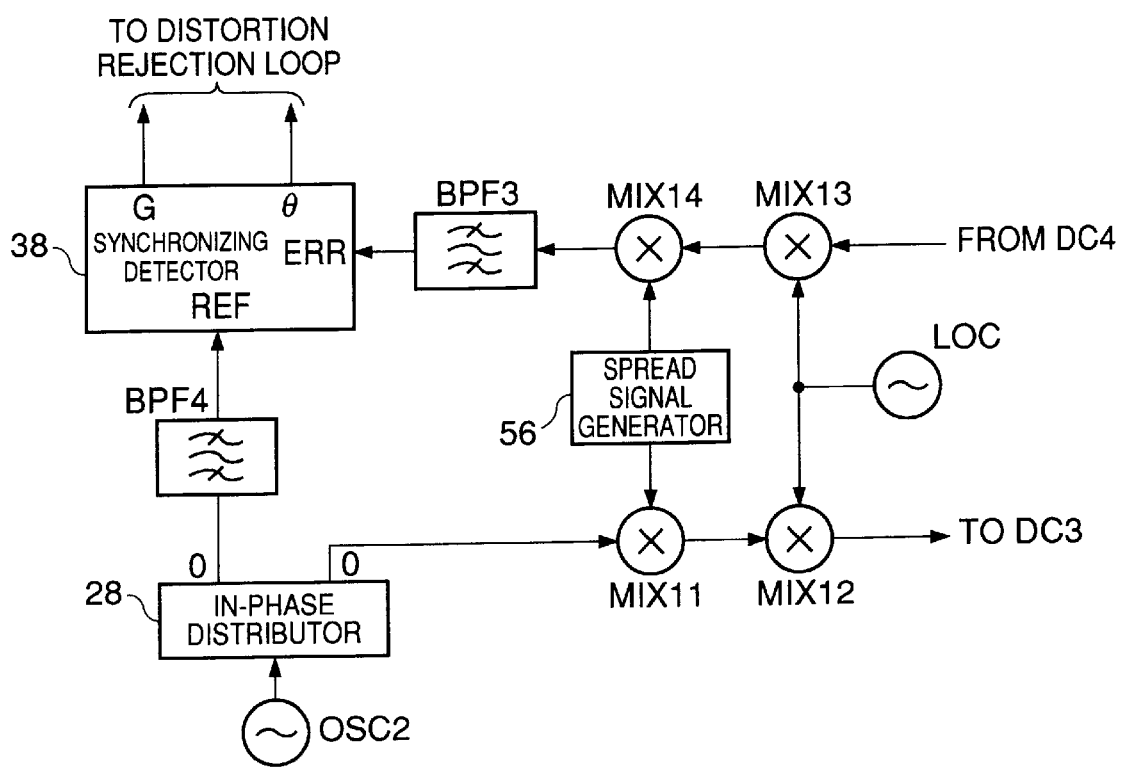
FIG. 7 is a diagram showing a variation example of the control circuit, especially of a section related to its distortion rejection loop, in the present embodiment.

Furthermore, as shown in FIG. 7, the pilot signal for L2 may be subjected to spread spectrum modulation. In the Figure, the oscillated output of oscillator OSC2 is subjected to in-phase two-way division by the in-phase distributor 28, and distributed to synchronizing detector 38 and mixer MIX11. The signal distributed to mixer MIX11 is modulated into a direct sequence spread spectrum by a spreading code generated by the spreading code generator 56. The resulting signal is then converted to a higher frequency in mixer MIX12 using the output front the local oscillator LOC, and is finally supplied to directional coupler DC3. A signal from directional coupler DC4 is converted to the frequency of the oscillator OSC2 in mixer MIX13 using the output from the local oscillator LOC. This signal is then despread in mixer MIX14 by a spreading code generated in the spreading code generator 56, to be demodulated back to the original signal. Subsequently, this signal is input as the error signal ERR into the synchronizing detector 38 via band-pass filter BPF3.

In FIG. 1 and in the conventional technique shown in FIG. 8, a continuous wave (CW), namely, an unmodulated signal, is used as the pilot signal for L2. Accordingly, when the frequency of the pilot signal for L2 was set closely adjacent to or within the operating band of the amplifier, namely, the frequency band wherein a number of carriers are densely located, mutual interference occurred between the pilot signal for L2 and the carrier components (or the carrier's spurious components). It is therefore necessary to set the frequency of the pilot signal for L2 at a frequency that is sufficiently remote from the operating band of the amplifier to prevent mutual interference. However, under such a setting, although an optimal distortion elimination and suppression performance may be achieved at the frequency of the pilot signal for L2, distortion elimination and suppression performance within the band at which the amplifier is actually operated does not necessarily become optimal.

The pilot signal for L2 having a spread spectrum, on the other hand, acts as a pseudo noise with respect to the carrier components. Accordingly, the above-described mutual interference does not occur even if the base frequency of the pilot signal for L2 is set within the operating band of the amplifier. It is therefore possible to use a pilot signal for L2 having the base frequency within the operating band of the amplifier. This means that the distortion elimination and suppression performance can be optimized within the band at which the amplifier is actually operated. The "base frequency" of the pilot signal for L2 denoted herein is defined as the sum of the oscillating frequency of the oscillator OSC2 and the oscillating frequency of the local oscillator LOC. When frequency upconversion and downconversion using a local oscillator LOC are not executed, or when frequency conversions are conducted over multiple stages, the definition of "base frequency" varies accordingly.

When the operating band of the amplifier is slightly changed while the spread spectrum pilot signal for L2 is being used, it is only necessary to alter the oscillating frequency of the local oscillator LOC. The frequency of the pilot signal for L2 need not be changed. Accordingly, use of the spread spectrum pilot signal for L2 advantageously facilitates change of pilot signal frequency following a change in the operating band.

When the frequency of the spread spectrum pilot signal for L2 is upconverted before insertion into the dominant path as shown in FIG. 7, the frequency of the signal to be spread/despread can be lower compared to a case when the insertion into the dominant path is performed without upconversion. In other words, the upconversion can prevent the synchronizing detector 38 from operating in critical conditions, provide wider band for device operation, and render such operation to be relatively stable. Further, improvement in device characteristics can be achieved because a band-pass filter BPF3 having an excellent interference elimination and suppression characteristics can easily be provided at a low cost.

Naturally, application of the present invention is not limited to transmission devices for mobile communications.

(3) Reference Example

The FF amplifier disclosed in U.S. Pat. No. 5,528,196 is similar to the above-described embodiment in that the pilot signal for L1 is eliminated and the step-by-step procedure under CPU control is no longer necessary. For the purpose of comparison of that art with the device shown in FIG. 1, illustrated in FIG. 9 is a circuit configuration provided by modifying the conventional circuit shown in FIG. 8 through application of the technique disclosed in the above U.S. patent. It should be noted that the illustrated configuration itself is not the invention of the above-mentioned U.S. patent, and, in a strict sense, the circuit of FIG. 9 is a novel structure that is neither disclosed nor suggested in the above patent. The control circuit 10A shown in FIG. 9 includes a differential comparator 16 for optimizing the distortion detection loop L1, and a L2 control unit 18 for optimizing the distortion rejection loop L2.

A first difference between the circuits shown in FIG. 1 and FIG. 9 concerns how the circuits operate with respect to a signal having less correlation with the input signal applied from the signal input terminal IN.

In the circuit of FIG. 1, the carrier components constantly present in the error signal ERR used in the distortion detection loop L1 are subjected to synchronizing detection. This synchronizing detection is performed using as the reference signal a signal obtained by regulating the level of a signal from the dominant path. Accordingly, the signal extracted by the synchronizing detector 36 for use as the control signal for variable attenuator ATT1 and variable phase shifter PS1 is a signal having corelation with the input signal applied to the signal input terminal IN, namely, the plurality of carrier components within the error signal. Signals having less correlation with the dominant signal such as a random noise are thereby prevented from being extracted in a similar manner as the distortion components generated in the main amplifier A1.

In the circuit of FIG. 9, on the other hand, the following procedure is executed. The signal from directional coupler DC5 is distributed to the amplitude detector 24 and the phase detector 26 through in-phase division by in-phase distributor 20. The signal from directional coupler DC6 is distributed to the amplitude detector 24 and the phase detector 26 through in-phase division by in-phase distributor 22. These signals are input at the resistance bridges disposed inside the amplitude detector 24 and the phase detector 26. Through square-law detection of the outputs from these resistance bridges, a direct current amplifier is differentially operated. According to this procedure, differential comparison is made for extracting even mode components, and any signal component can be the object of detection regardless of whether it has correlation with the dominant signal. As a result, a random noise may be extracted for use as the control signal for variable attenuator ATT1 and variable phase shifter PS1.

In the manner described above, the former circuit, namely, the embodiment of the present invention, theoretically has superior resistance to noise compared to the latter circuit, namely, the simple combination of conventional techniques.

A second difference between the circuits shown in FIG. 1 and FIG. 9 concerns the extracting locations of the signals to be inserted into the control circuit.

In the circuit of FIG. 1, the signal within the path from hybrid HYB2 to hybrid HYB3 passing through the auxiliary amplifier A2 and the signal from the signal output terminal OUT are input into the synchronizing detector 36 as signals ERR and REF. The illustrated extraction point of each of these signals is just one example. When practicing the present invention, so long as the electrical wave lengths from the respective input terminals of ERR and REF on the synchronizing detector 36 to the signal coupling point in hybrid HYB2 are identical to one another, the extraction point of the error signal ERR can be any point within the path from hybrid HYB2 to hybrid HYB3 passing through the auxiliary amplifier A2, and the extraction point of the reference signal REF can be any point within the dominant path. Such a high degree of flexibility and design freedom is permitted because the circuit of FIG. 1 performs synchronizing detection of an error signal based on the dominant signal, as described above.

In the circuit of FIG. 9, on the other hand, two separate signals are extracted from locations adjacent to the input terminals of hybrid HYB2 for insertion into the differential comparator 16. As differential comparison is conducted in this circuit, the extracting points of those signals cannot be largely changed. Accordingly, the circuit of FIG. 1 has a higher degree of design freedom. In FIG. 9, directional coupler DC5 is shown adjacent to the input terminal of hybrid HYB2 for the convenience of illustration. However, it is actually undesirable to dispose directional coupler DC5 adjacent to the input terminal of hybrid HYB2 on the dominant path side because the amplitude of the carriers is extremely large at the input terminal of hybrid HYB2 on the dominant path side while the same is small at the input terminal of hybrid HYB2 on the coaxial delay line side D1. For preferable operation of the differential comparator 16, directional coupler DC5 should be disposed where the carrier amplitude is smaller. Located inside hybrid HYB2 are a circuit section for branching the dominant signal in two and another circuit section for combining one of the branched signal with the signal transmitted via the coaxial delay line D1. As the carrier amplitude is small in the path connecting the two circuit sections, it is desirable to position directional coupler DC5 in that path.

A third difference between the circuits shown in FIG. 1 and FIG. 9 is the presence or absence of the ALC circuit 40.

In the circuit of FIG. 1, a portion of the dominant signal is input into the synchronizing detector 36 via the ALC circuit 40 as the reference signal REF. The circuit of FIG. 1 then performs synchronizing detection of signal ERR based on this reference signal REF. More specifically, to perform synchronizing detection of the error signal, the level of a signal from the dominant path is regulated, and the obtained signal is used as the reference signal to eliminate the influence of an offset voltage.

The effective dynamic range of the synchronizing detector 36 is determined by the dynamic range of the ALC circuit 40, while the dynamic range of the ALC circuit 40 is determined by the amount of change in the gain of amplifier or buffer B3 and the attenuation of variable attenuator ATT3. Accordingly, by enlarging the range of change in the gain and the attenuation, the effective dynamic range of the synchronizing detector 36 can easily be expanded. On the other hand, such ALC circuit 40 is not employed in the circuit of FIG. 9.

A fourth difference between the circuits shown in FIG. 1 and FIG. 9 concerns the method for generation of the control signal for the distortion rejection loop L2. Specifically, while the circuit of FIG. 1 uses the pilot signal for L2 as the reference signal for synchronizing detector 38 without performing modulation, the circuit of FIG. 9 modulates the pilot signal for L2 with a low-frequency oscillation output before using it as the reference signal.

More specifically, in the circuit of FIG. 9, the oscillation output of the local oscillator LOC is first subjected to in-phase two way division by in-phase distributor 28 and is supplied to hybrid HYB4 and in-phase distributor 32. Using this signal, hybrid HYB4 generates an orthogonal signal, namely, a signal including I component (0) and Q component ($\pi/2$). This orthogonal signal and the orthogonal oscillation output from the low-frequency oscillator OSC2 are mixed by mixers MIX3 and MIX4. The in-phase combiner 37 performs in-phase combining of the resulting signal, thereby generating the pilot signal for L2 related to one of the sidebands. Further, in the circuit of FIG. 9, mixers MIX5 and MIX6 mix the signals supplied by in-phase two way division of the in-phase distributor 32 with the signals from directional couplers DC7 and DC8, respectively. The synchronizing detector then performs synchronizing detection of the output of mixer MIX6 using the output of mixer MIX5 as the reference, thereby generating the control signal for variable attenuator ATT2 and variable phase shifter PS2.

Accordingly, although the circuit of FIG. 9 controls the distortion rejection loop L2 by synchronizing detection as in the circuit shown in FIG. 1, the circuit of FIG. 9 has the disadvantage of circuit configuration complexity. The complexity is caused by factors such as the necessity to modulate the local oscillation signal by the low-frequency oscillation output and extract one sideband when generating the pilot signal for L2.

As is apparent from the above-described differences, modifying the conventional circuit shown in FIG. 8 based on the disclosure by the above-mentioned U.S. patent would not yield the circuit shown in FIG. 1. Specifically, in the device shown in FIG. 1 and other examples, the ALC circuit 40 is employed in connection with average detection so that the dominant signal can be used as the reference signal REF for synchronizing detector 36. This idea cannot be conceived from the above-mentioned U.S. patent.

In addition to the above-mentioned U.S. patent, there also exist other conventional techniques disclosed in Japanese Patent Laid-Open Publications No. Hei 6-244647 and No. Hei 6-85548. In the circuits of these publications, the pilot signal for L2 is subjected to spectral spreading and then inserted in the dominant path, while a signal detected in the dominant path is subjected to spectral despreading. Based on the results obtained from this procedure, the operation of the distortion rejection loop L2 is adjusted and controlled. However, these publications nowhere mention or infer use of the synchronizing detector 36, use of the ALC circuit 40 that allows effective use of the synchronizing detector 36, or elimination of the pilot signal for L1. Further, as these publication recite performing spectral spreading of the pilot signal for L1, it can be said that the techniques disclosed in these publications deviate from the fundamental concept of the present invention to eliminate the pilot signal for L1. Accordingly, there is no motivation for those skilled in the art to combine the techniques disclosed in these publications with the conventional art shown in FIG. 8 of the present application or with the above-mentioned U.S. patent. Even if combined, differences similar to those that exist between the structure of FIG. 9 and the structure of the present invention would still exist between the resulting structure and the structure of the present invention.

What is claimed is:

1. A distortion compensation method for compensating distortion components included in an output signal from a main amplifier when an input signal including a plurality of carrier components each having a different frequency from one another is amplified and output by said main amplifier, comprising steps of:

generating a distortion signal by combining, at a first coupling point, a first branch signal branched from said input signal at a first branching point with a second branch signal branched from said output signal at a second branching point;

preventing said plurality of carrier components from leaking from said first or second branch signal into said distortion signal, wherein said step of generating the distortion signal is executed while performing amplitude and phase adjustment according to a control signal in at least one of a plurality of signal paths from said first branching point to said first coupling point such that said distortion signal is rendered to primarily indicate said distortion components;

generating a distortion compensated signal based on said output signal by compensating said distortion components included in said output signal using said distortion signal, said distortion components being either suppressed or eliminated in said distortion compensated signal; and generating said control signal by performing synchronizing detection of said distortion signal using a reference signal as reference, wherein said reference signal is generated based on any one of said input signal, said output signal, or said distortion compensated output signal, or based on a branch signal of any one of those signals, said reference signal including said plurality of carrier components and being regulated to a level such that average power of said reference signal does not alter even when a total average power of the carrier components included therein changes.

2. The distortion compensation method defined in claim 1, wherein said amplitude and phase adjustment is executed by vector modulation.

3. The distortion compensation method defined in claim 1, wherein said distortion signal is converted to a lower frequency prior to said synchronizing detection.

4. The distortion compensation method defined in claim 2, wherein said distortion signal is converted to a lower frequency prior to said synchronizing detection.

5. A control circuit used in an amplifier with feedforward loops for compensating non-linear distortion, said amplifier with feedforward loops for compensating non-linear distortion having distortion detection means and distortion compensation means; said distortion detection means including a main amplifier, a distortion detection loop, and first amplitude and phase adjustment means; said main amplifier receiving input of an input signal including a plurality of carriers each having a different frequency from one another, and outputting an output signal as a result of amplification; said distortion detection loop generating a distortion signal by combining, at a first coupling point, a first branch signal branched from said input signal at a first branching point with a second branch signal branched from said output signal at a second branching point; said first amplitude and phase adjustment means being means for preventing said plurality of carrier components from leaking from said first or second branch signal into said distortion signal, and operating said distortion detection loop by performing amplitude and phase adjustment on a signal related to said main amplifier according to a first control signal in at least one of a plurality of signal paths from said first branching point to said first coupling point such that said distortion signal is rendered to primarily indicate said distortion components; said distortion compensation means being means for generating a distortion compensated signal based on said output signal by compensating said distortion components included in said output signal using said distortion signal, said distortion components being either suppressed or eliminated in said distortion compensated signal; said control circuit comprising:

an automatic level control circuit for generating a reference signal based on any one of said input signal, said output signal, or said distortion compensated output signal, or upon a branch signal of any one of those signals, said reference signal including said plurality of carrier components and being regulated to a level such that average power of said reference signal does not alter even when a total average power of the carrier components included therein changes; and a first synchronizing detector for generating said first control signal by performing synchronizing detection of said distortion signal using said reference signal as a reference.

6. The control circuit defined in claim 5, wherein said first amplitude and phase adjustment means include a vector modulator for vector-modulating a signal to be subjected to amplitude and phase adjustment.

7. The control circuit defined in claim 5, further comprising means for converting said distortion signal to a lower frequency prior to said synchronizing detection.

8. The control circuit defined in claim 6, further comprising means for converting said distortion signal to a lower frequency prior to said synchronizing detection.

9. The control circuit defined in claim 5 in which said distortion compensation means includes an auxiliary amplifier, a distortion rejection loop, and a second amplitude and phase adjustment means; said auxiliary amplifier amplifying said distortion signal; said distortion rejection loop generating said distortion-compensated output signal by recombining said distortion signal with said output signal; said second amplitude and phase adjustment means being means for preventing said distortion components from leaking from said output signal and said distortion signal into said distortion-compensated output signal, and performing amplitude and phase adjustment, according to a second control signal, on said distortion signal either input into or output from said auxiliary amplifier; said control circuit further comprising:

pilot signal inserting means for inserting a pilot signal into said output signal in a signal path from said first branching point to said second branching point;

signal branching means for branching a fourth branch signal from said distortion-compensated output signal; and a second synchronizing detector for generating said second control signal by performing synchronizing detection of said fourth branch signal using said pilot signal as reference.

10. The control circuit defined in claim 9, further comprising:

means for spreading the spectrum of said pilot signal prior to its insertion; and means for despreading the spectrum of said fourth branch signal prior to synchronizing detection using said pilot signal as reference.

11. The control circuit defined in claim 9, further comprising:

means for oscillating said pilot signal at an oscillation frequency lower than an operating frequency band of said main amplifier;

means for converting said pilot signal, prior to its insertion, to a frequency within said operating frequency band; and means for converting said fourth branch signal to a frequency identical to said oscillation frequency of said pilot signal prior to synchronizing detection using said pilot signal as reference.

12. The control circuit defined in claim 10, further comprising:

means for oscillating said pilot signal at an oscillation frequency lower than an operating frequency band of said main amplifier;

means for converting said pilot signal, prior to its insertion, to a frequency within said operating frequency band; and means for converting said fourth branch signal to a frequency identical to said oscillation frequency of said pilot signal prior to synchronizing detection using said pilot signal as reference.

13. The control circuit defined in claim 12, wherein:

said pilot signal is first subjected to spectrum spreading, subsequently converted to a frequency within said operating frequency band of said main amplifier, and then inserted; and said fourth branch signal is first converted to a frequency identical to said oscillation frequency of said pilot signal, subsequently subjected to spectrum despreading, and then subjected to synchronizing detection using said pilot signal as reference.

14. An amplifier with feedforward loops for rejecting non-linear distortion, comprising:

a main amplifier;

distortion detection means;

distortion compensation means;

first and second amplitude and phase adjustment means; and control circuit defined in claim 9.

\* \* \* \* \*